United States Patent
Tralshawala et al.

(10) Patent No.: US 8,232,801 B2
(45) Date of Patent: Jul. 31, 2012

(54) NUCLEAR QUADRUPOLE RESONANCE SYSTEM AND METHOD FOR STRUCTURAL HEALTH MONITORING

(75) Inventors: Nilesh Tralshawala, Rexford, NY (US); Thomas Alan Early, Clifton Park, NY (US); William Thomas Dixon, Clifton Park, NY (US); Waseem Ibrahim Faidi, Schenectady, NY (US); Thomas Miebach, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/174,488

(22) Filed: Jun. 30, 2011

(65) Prior Publication Data
US 2012/0025827 A1    Feb. 2, 2012

(51) Int. Cl.
*G01V 3/00*    (2006.01)

(52) U.S. Cl. ...................................................... 324/310

(58) Field of Classification Search ........... 324/300–322
See application file for complete search history.

(56) References Cited

U.S. PATENT DOCUMENTS

| | | | |
|---|---|---|---|
| 5,206,592 A | 4/1993 | Buess et al. | |
| 5,233,300 A | 8/1993 | Buess et al. | |
| 5,365,171 A | 11/1994 | Buess et al. | |
| 5,986,455 A | 11/1999 | Magnuson | |
| 6,118,124 A | 9/2000 | Thundat et al. | |
| 6,144,199 A * | 11/2000 | Sharf et al. | 324/306 |
| 6,242,918 B1 | 6/2001 | Miller et al. | |
| 6,291,994 B1 | 9/2001 | Kim et al. | |
| 6,392,408 B1 | 5/2002 | Barrall et al. | |
| 6,489,767 B1 | 12/2002 | Prado et al. | |
| 6,566,873 B1 | 5/2003 | Smith et al. | |
| 6,586,933 B1 | 7/2003 | Hardy et al. | |
| 6,608,479 B1 | 8/2003 | Dixon et al. | |
| 6,900,633 B2 | 5/2005 | Sauer et al. | |
| 6,914,428 B2 | 7/2005 | Dixon et al. | |
| 6,977,503 B2 | 12/2005 | Prado | |
| 7,009,395 B2 | 3/2006 | Dixon et al. | |
| 7,099,499 B2 | 8/2006 | Blezek et al. | |
| 7,163,749 B2 | 1/2007 | Iacovangelo et al. | |
| 7,211,044 B2 | 5/2007 | Mast et al | |
| 7,362,182 B2 | 4/2008 | Barabash et al. | |
| 7,473,250 B2 | 1/2009 | Makin et al. | |
| 7,494,467 B2 | 2/2009 | Makin et al. | |
| 7,695,436 B2 | 4/2010 | Mast et al. | |
| 7,714,573 B2 | 5/2010 | Edwards | |
| 7,806,839 B2 | 10/2010 | Mast et al. | |
| 7,846,096 B2 | 12/2010 | Mast et al. | |

(Continued)

OTHER PUBLICATIONS

Hewitt, et al., "Nuclear Quadrupole Resonance as a Nondestructive Probe in Polymers," J. Appl. Physics, vol. 43 (8), (1972).

(Continued)

*Primary Examiner* — Dixomara Vargas
(74) *Attorney, Agent, or Firm* — Seema Katragadda (57) ABSTRACT

Structural health monitoring using nuclear quadrupole resonance is disclosed. For example, in one embodiment, a method of monitoring stress is provided. The method includes scanning a composite using an NQR spectrometer, the composite having a polymer matrix and a microcrystalline material disposed in the matrix. The microcrystalline material includes molecules having nuclei with respective nuclear quadrupole moments. The method also includes determining microscopic strain distribution indices of the composite from the NQR scans to quantify stress and identify precursors to failure in the composite.

10 Claims, 5 Drawing Sheets

U.S. PATENT DOCUMENTS

| | | | |
|---|---|---|---|
| 7,883,468 B2 | 2/2011 | Makin et al. | |
| 7,951,095 B2 | 5/2011 | Makin et al. | |
| 7,969,142 B2 * | 6/2011 | Krueger et al. | 324/207.16 |
| 2004/0121167 A1 | 6/2004 | Iacovangelo et al. | |
| 2004/0265235 A1 | 12/2004 | Uzgiris et al. | |
| 2005/0234438 A1 | 10/2005 | Mast et al. | |
| 2005/0240105 A1 | 10/2005 | Mast et al. | |
| 2005/0240123 A1 | 10/2005 | Mast et al. | |
| 2005/0240124 A1 | 10/2005 | Mast et al. | |
| 2005/0240125 A1 | 10/2005 | Makin et al. | |
| 2005/0261585 A1 | 11/2005 | Makin et al. | |
| 2005/0261586 A1 | 11/2005 | Makin et al. | |
| 2005/0261587 A1 | 11/2005 | Makin et al. | |
| 2005/0261588 A1 | 11/2005 | Makin et al. | |
| 2005/0261611 A1 | 11/2005 | Makin et al. | |
| 2005/0277853 A1 | 12/2005 | Mast et al. | |
| 2006/0018835 A1 | 1/2006 | Malenfant et al. | |
| 2006/0074291 A1 | 4/2006 | Hardy et al. | |
| 2006/0093555 A1 | 5/2006 | Torres et al. | |
| 2008/0145727 A1 | 6/2008 | Faidi et al. | |
| 2008/0287837 A1 | 11/2008 | Makin et al. | |
| 2009/0198156 A1 | 8/2009 | Mast et al. | |
| 2009/0253983 A1 | 10/2009 | Foo et al. | |
| 2009/0256569 A1 | 10/2009 | Hancu et al. | |
| 2009/0308454 A1 | 12/2009 | Korevaar et al. | |
| 2010/0018311 A1 | 1/2010 | Batzinger et al. | |
| 2010/0126277 A1 | 5/2010 | Wu et al. | |
| 2010/0134098 A1 | 6/2010 | Faidi et al. | |
| 2010/0256490 A1 | 10/2010 | Makin et al. | |
| 2010/0312150 A1 | 12/2010 | Mast et al. | |
| 2010/0321012 A1 | 12/2010 | May et al. | |
| 2011/0040184 A1 | 2/2011 | Mast et al. | |
| 2011/0090110 A1 | 4/2011 | Tralshawala et al. | |
| 2011/0135872 A1 | 6/2011 | May et al. | |
| 2011/0201975 A1 | 8/2011 | Makin et al. | |
| 2011/0215799 A1 | 9/2011 | Goodbole et al. | |

OTHER PUBLICATIONS

Nickel, et al., "NQR Method for Sress and Pressure Imaging", Journal of Magnetic Resonance, Series A 111, pp. 191-194, 1994.

Ward, et al., "Quality Control and Health Monitoring of Aero-Space Composites via Quadrupole Resonance," Proceedings of SPIE—The International Society for Optical Engineering, vol. 5767, pp. 308-318, 2005.

Long Chen, et al. "Contact Stress and Deformation of Blade Bearing in Wind Turbine", 2010 International Conference on Measuring Technology and Mechatronics Automation (IEEE), Mar. 13-14, 2010, ISBN: 978-0-7695-3962-1.

Yuanying Mei, et al. "Detection and Damage Diagnosis for Wind Turbine Blades Based on the Theory of Length Fractal Dimension on Dynamic Properties", 2010 Intenational Conference on Measuring Technology and Mechatronics Automation (IEEE), Mar. 13-14, 2010, ISBN: 978-0-7695-3962-1.

Nickel, et al., "NQR Method for Stress and Pressure Imaging", Journal of Magnetic Resonance, Series A 111, pp. 191-194, 1994.

* cited by examiner

NUCLEAR QUADRUPOLE RESONANCE SYSTEM AND METHOD FOR STRUCTURAL HEALTH MONITORING

BACKGROUND

The subject matter disclosed herein relates to structural health monitoring of materials, and more specifically, to systems and methods for structural health monitoring using nuclear quadrupole resonance.

In general, nuclear quadrupole resonance (NQR) spectroscopy is a chemical analysis method for obtaining information relating to the local environment surrounding certain atoms and, more specifically, certain nuclei. For example, nuclei that have a quantum spin number greater than ½ can have an electric quadrupole moment. The electric quadrupole moment can be affected by a nucleus' local electronic environment, such as the nature of certain chemical bonds in the vicinity of the nucleus, and also by ionized atoms in the vicinity of the nucleus. The quadrupolar nuclei, as a result of their electronic environment, exhibit certain energy states. The differences between these energy states often fall in the range of the radiofrequency (RF) portion of the electromagnetic spectrum. Therefore, in a similar manner to nuclear magnetic resonance (NMR) spectroscopy, NQR spectra may be obtained nondestructively with an RF receiver, such as an RF coil.

However, unlike NMR, which uses a static magnetic field to align the electric dipole of certain gyromagnetic nuclei (e.g., those having quantum spin numbers of ½), NQR relies on the local electronic environment surrounding the quadrupolar nuclei to orient the nuclei in certain directions. In this way, NQR can be especially sensitive to the local electrical environment surrounding the quadrupolar nuclei. Other factors that can affect an NQR spectrum of a given nucleus include the temperature and/or the crystalline state of a sample having the nucleus of interest. Therefore, the NQR spectrum of a given nucleus within a sample may vary from location to location, depending at least on chemical environments, local crystal structures, temperature variations, and so forth.

BRIEF DESCRIPTION

In one embodiment, an article of manufacture is provided that includes a component or structure formed from a composite. The composite includes a matrix having a polymer and a microcrystalline material disposed in the matrix, wherein the microcrystalline material is capable of nuclear quadrupole resonance (NQR) and is adapted to produce one or more NQR spectral signals indicative of average local strain and a microscopic strain distribution within the composite.

In another embodiment, a method of monitoring stress in a composite is provided. The method includes scanning the composite using an NQR spectrometer, the composite having a polymer matrix and a microcrystalline material disposed in the matrix, wherein the microcrystalline material has molecules with nuclei having respective nuclear quadrupole moments. The method also includes correlating one or more locations of the composite with NQR spectra collected at the one or more locations to produce localized NQR spectra, determining a line width for a spectral line of interest within each localized NQR spectrum, generating an average local strain map of at least a portion of the composite from the NQR scan; comparing the generated average local strain map to an original strain map of the composite, and determining differences between the generated average local strain map and the original strain map based on the comparison of local strain data contained within each map to quantify fatigue in the composite.

In a further embodiment, an NQR spectrometry system is provided. The system includes a control circuit comprising one or more processors configured to execute one or more routines to perform an analysis of localized NQR spectra collected by an RF probe to produce an average local strain map and a microscopic strain distribution index of one or more locations of a composite to identify structural abnormalities within the composite, wherein the composite comprises an NQR-active microcrystalline material disposed within a matrix.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Obtaining indications of precursors (or precursor signatures) to mechanical failure of various articles of manufacture can be a useful tool for predicting article life, as well as for indicating when servicing of the manufactured articles may be appropriate. Typically, such indicators are based on visual and/or mechanical inspections by a technician. For example, a technician may visually inspect for cracks, delamination, and warping of the article. Some techniques involve the use of ultrasound machines to detect similar deformities. However, inspection methods such as these detect the damage after it has occurred and may fail to detect failure precursors, such as microcracks and onset of fatigue. That is, small failure indicators may not be visible to the naked eye or may not provide a sufficient signal differentiation from the bulk article for detection by certain technologies (e.g., ultrasound technologies). Indeed, some failure modes can go undetected for a period of time, resulting in an unusable article or in significant and costly repairs.

The embodiments disclosed herein overcome these and other shortcomings of typical approaches by providing systems and methods for structural health monitoring using NQR. For example, certain of the present embodiments include composites doped with microcrystalline materials exhibiting NQR activity. The crystalline structure of these materials may exhibit certain characteristic NQR frequencies. When the crystalline structure of these materials is disturbed, for example by the application of a mechanical stress, these frequencies may change. Therefore, microcrystals located within or proximate an area where stress has been applied or that is undergoing a mechanical change (e.g., a crack) may produce NQR spectral lines that are different than the spectral lines obtained from undisturbed areas. These spectral line changes may be used to locate areas of fatigue, failure, or incipient failure. For example, in embodiments where the strain is distributed non-uniformly on a microscopic scale, the NQR spectra obtained using the approaches described herein may reveal a distribution of closely spaced overlapping NQR lines. These closely-spaced overlapping lines may cause an overall spectral line width broadening. In composite materials, these situations occur at the elastic limit of the composite. Accordingly, by monitoring such broadening of one or more spectral lines of interest of a composite having NQR-active materials, it may be possible to determine the onset or the presence of structural defects. Specifically, in certain embodiments of the approaches described herein, a microscopic strain distribution index may be determined for one or more locations of the composite to monitor fatigue and/or perform lifing of an article of manufacture having the composite. In certain embodiments, the microscopic strain distribution index may be defined as a ratio between a full width at half maximum (FWHM) and a central NQR line frequency for a spectral line of interest. In one embodiment, the microscopic strain distribution index is defined as the FWHM divided by the central NQR line frequency.

In some embodiments, NQR measurements may enable precursors to failure, such as the transition from an elastic state to a plastic state of the composite, to be observed. Similarly, in some embodiments, the bulk of a composite or the bulk of an article of manufacture may be constructed using an NQR-active material. Using the sensitivity of these NQR materials to small changes in local electrical environments, such as those arising from mechanical stress and deformation, it may be possible to obtain indications of incipient article failure.

In addition to providing NQR-active composites for incorporation into or coating onto an article of manufacture, the present embodiments provide systems and methods for monitoring their NQR activity. For example, in accordance with certain embodiments, an NQR spectrometry system, such as a portable system, is provided to allow a technician to perform on-site testing of certain articles of manufacture that may otherwise be difficult to envelop within an RF coil. The portable system may include an RF probe and associated spectroscopic circuitry for scanning over a surface of the article to obtain localized NQR spectra. The localized spectra may, in turn, be used to generate a 2-D or 3-D strain map. For example, in one embodiment, the localized spectra may be used to generate a microscopic strain distribution index map.

Again, as noted above, these maps may be one type of strain map of the article in accordance with certain of the methods disclosed herein. However, in other embodiments, a strain map may refer to a map generated using one or more spectral indicators of strain, such as line shifting, line broadening, and so on. For example, line shifting of a spectral line of interest may be a macroscopic indicator of strain, while line broadening, or, more specifically, a microscopic strain distribution index determined from line broadening, is possibly a microscopic indicator of a strain distribution within the observed location. In certain embodiments, these strain maps, microscopic strain distribution indices and index maps, and/or NQR spectra may be used to determine the operational life of the article for its typical use or to detect precursor signatures to failure of the article. For example, in one embodiment, a wind turbine blade may be constructed having a composite with an NQR tracer. Using certain of the embodiments described herein, an average operating life of the wind turbine blade may be determined.

Figure 1:
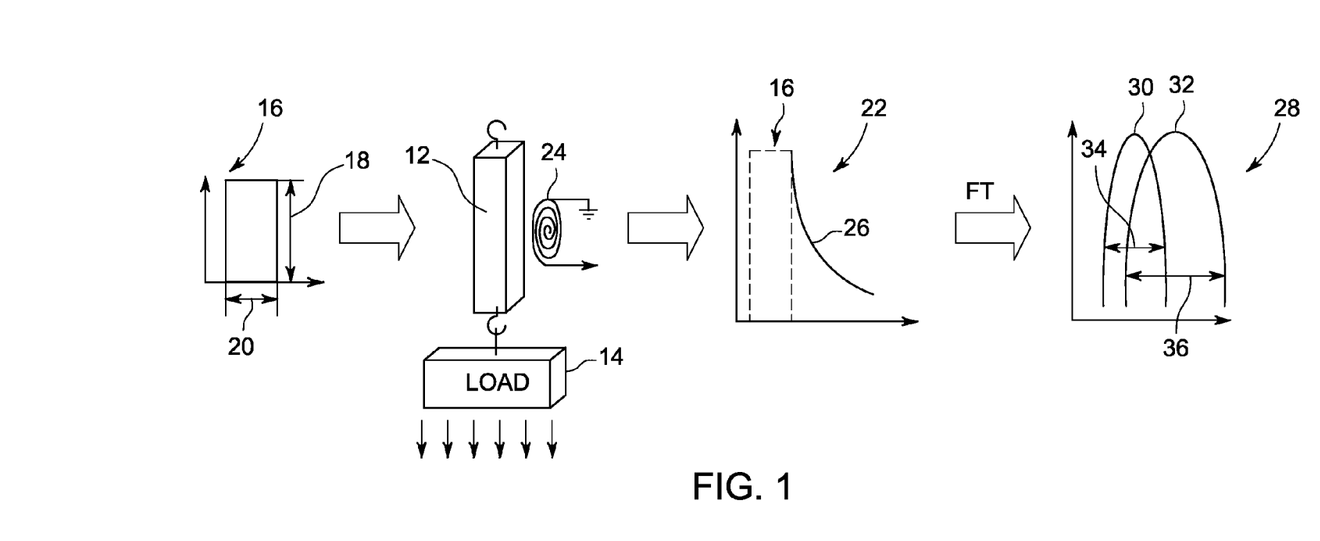
FIG. 1 is a schematic illustration of an embodiment of a nuclear quadrupole resonance measurement to determine strain levels in a composite.

FIG. 1 schematically depicts an embodiment of a measurement 10 of the NQR spectra of certain NQR-active nuclei within a composite 12 in response to an applied load 14. Specifically, the composite 12 is formed from an NQR-active material (i.e., a material having at least one nucleus with a quantum spin number greater than $\frac{1}{2}$). However, as is discussed with respect to FIGS. 2-5, the composite 12 may be doped with NQR-active tracers, such as NQR-active microcrystalline materials. As illustrated in FIG. 1, the measurement 10 includes an applied RF pulse 16 having a certain power 18 and duration 20 that corresponds to a desired NQR response 22 of NQR-active nuclei within the composite 12. The pulse 16 is applied, for example, using an RF coil or similar device for transmitting RF energy at certain desired frequencies and energies. Generally, the RF frequency and energy of the pulse 16 will correspond to a resonant frequency of certain of the NQR active nuclei. The pulse 16 results in the gyromagnetic nuclei being excited to an excited spin state. After the pulse 16 is applied, the nuclear spins, which are in their excited spin state, begin to relax and emit a signal, which is the NQR response 22.

The NQR response 22 is acquired using an RF receiving coil 24, which captures the signal as the nuclear spins precess and relax (spin-spin relaxation), which is in the form of a free induction decay (FID) 26. The FID 26 is then used to generate NQR spectra 28. For example, a Fourier transform may be performed on the FID 26 to generate the spectra 28. In the illustrated embodiment, prior to applying the load 14, the NQR nuclei within the composite 12 emit a first response, resulting in a first NQR spectral line 30. However, after applying the load 14 to the composite 12, which results in a change of the local electric field of at least a portion of the NQR-active nuclei, the first NQR spectral line 30 shifts to a second NQR spectral line 32. Such a shift may be indicative of a macroscopic strain change (i.e., a change in the average strain) at the observed location of the composite 12. That is, the resonant frequency of the NQR-active nuclei shifts as strain inducing forces are applied. It should be noted that, in some situations, such a shift may be observed when the composite begins to reach its mechanical limits. In addition to, or in lieu of, the shift in the spectral line 30 to spectral line 32, a spectral line width 34 of the first NQR spectral line 30 may broaden as the load 14 is applied. Such broadening could, under certain circumstances, represent a microscopic strain distribution within the observed location. Accordingly, the shift in the NQR frequency of spectral line 30 is a macroscopic indicator of an average strain change in a given location, while the broadening of the spectral line 30 is a microscopic indicator of the distribution of the strain at the location. Indeed, in some embodiments, the second NQR spectral line 32 may be broadened and/or shifted compared to the first NQR spectral line 30, depending on the nature of the deforming strain and the extent to which the composite 12 is affected. As noted above, a microscopic strain distribution index may be determined based on the broadened line width 36 of the second NQR spectral line 32 and the shift in the central NQR frequency from the first NQR spectral line 30 to the second NQR spectral line 32.

As noted above, while the illustrated embodiment depicts a shift in the first spectral line 30 to the second spectral line 32 as a result of the applied load 14, it should be noted that the spectra 28 may exhibit several different phenomena as a result of an applied force (e.g., a deforming strain). In certain embodiments, in a composite having a polymer with NQR-active nuclei, or a polymer having NQR-active tracers, varying amounts of stress may result in different phenomena. In one embodiment, as stresses are applied to the composite such that the polymer reaches its elastic limit, the NQR signal may broaden. As an example, the full width at half maximum (FWHM) (i.e., the line width 34) of the first spectral line 30 may increase as the polymer of the composite is stressed to its elastic limit, which may be represented by line width 36. Thus, the microscopic strain distribution index of the second spectral line 32 may be larger than the microscopic strain distribution index for the first spectral line 30, indicating increased stress and/or fatigue. Indeed, using the microscopic strain distributions determined for each location and, in some embodiments, strain maps generated from macroscopic strain change information (e.g., from spectral line shifts), the effect of stresses on a composite may be directly quantified and, in certain of these embodiments, used to determine the precursor signature to fatigue and the operational life of the composite. Further, as the polymer reaches its breaking limit, the broadened spectral line may resolve into several different spectral lines. Referring to the example above, the first spectral line 30 may broaden and/or shift, and then resolve into several different spectral lines at breakage.

As noted above, the composites discussed herein may be formed from an NQR-active material, or may include one or more different NQR-active tracers. In accordance with certain of the embodiments described herein, the composite may include one continuous layer with NQR-active tracers dispersed therein, as is described with respect to FIGS. 2 and 3. In other embodiments, a first composite layer may be coated with a second composite layer, the second composite layer including NQR-active tracers, as described with respect to FIG. 4. In further embodiments, a plurality of composite layers may each contain NQR-active tracers. In such embodiments, the polymers and/or the NQR-active tracers may be the same or different, as is described with respect to FIGS. 6 and 7.

Figure 2:
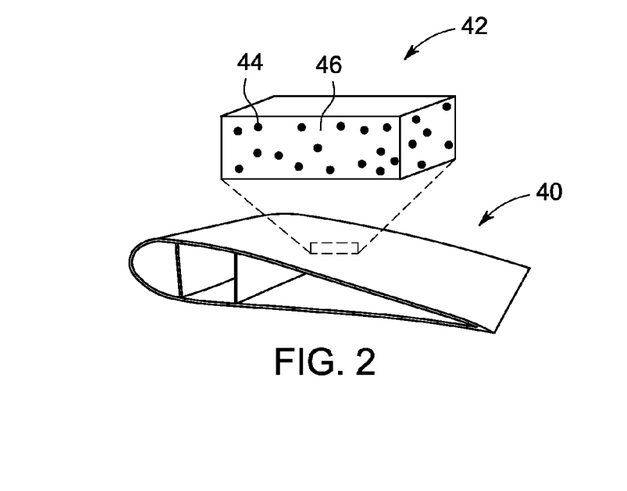
FIG. 2 is a schematic illustration of an embodiment of an article of manufacture having a composite with NQR tracers disposed in a matrix.

FIG. 2 illustrates an embodiment of an article of manufacture, specifically an airfoil 40, which includes a composite 42 having NQR-active tracers 44 dispersed therein. It should be noted that while the present embodiments are discussed in the context of an airfoil, they are also applicable to other composite structures, such as an airplane fuselage, a wing, a horizontal or vertical stabilizer, or similar aircraft feature. In the illustrated embodiment, the composite 42 is a substantially continuous layer formed from a mixture of the tracers 44 and a matrix material 46. The matrix material 46 may be a monomer, a prepolymer, an uncured polymer, a molten polymer, a dissolved polymer, or any combination thereof. For example, the matrix material 46 may include monomers such as olefins, urethanes, esters, acrylates, and epoxies, prepoly-mers formed from any or a combination of these monomers, or polymers formed from any or a combination of these monomers. The matrix material 46 may also include other materials that facilitate the deposition of the matrix-tracer mixture, such as solvents (e.g., water, organic solvents). Therefore, prior to application to a substrate, the NQR-active tracers 44 may be blended with the matrix material 46 prior to setting, or may be dispersed within the matrix material 46 prior to polymerization and/or curing.

Generally, the NQR-active tracers 44 may include any material that is capable of exhibiting NQR. Therefore, the NQR-active tracers 44 include molecules that have at least one atom having a nucleus with a quantum spin number greater than ½ (i.e., an electrical quadrupole moment). As an example, the molecules may include atoms such as boron ($^{10}$B and/or $^{11}$B), nitrogen ($^{14}$N), chlorine ($^{35}$Cl and/or $^{37}$Cl), manganese ($^{55}$Mn), cobalt ($^{59}$Co), copper ($^{63}$Cu and/or $^{65}$Cu), arsenic ($^{75}$As), bromine ($^{79}$Br and/or $^{81}$Br), antimony ($^{121}$Sb and/or $^{123}$Sb), or iodine ($^{127}$I), or any combination thereof. Molecules incorporating such atoms may include inorganic materials such as $Cu_2O$, $CuSe$, $NaClO_3$, $LiIO_3$, $KBrO_3$, $NH_4NO_3$, $Sb_2O_3$, $Mo_3Sb_7$, $SbSI$, $SbF_3$, $BiBr_3$, and certain alkali-chloroiodides. In other embodiments, the molecules incorporating such atoms may include organic molecules, such as halogenated hydrocarbyls (e.g., an iodinated hydrocarbyl, a brominated hydrocarbyl, or a chlorinated hydrocarbyl, or a combination).

In certain embodiments, as discussed below, it may be desirable to employ a crystalline NQR-active material. While, in a general sense, inorganic tracers are readily capable of crystallization due to their ionic bonds, certain of the organic NQR-active materials may be chosen to have molecular structures that facilitate crystal formation. As an example, such organic molecules may be chosen to have planar or semi-planar structures that are capable of aggregating via one or more intermolecular interactions such as pi-pi stacking, van der Waals forces, hydrogen bonding, ligand-metal interactions, ionic interactions, or any combination thereof. In certain embodiments, the organic NQR-active materials may include aromatic molecules and/or organometallic complexes having certain of the NQR-active atoms listed above. For example, in one embodiment, bis(4-chlorophenyl) sulfone (N-1) may be used to form microcrystalline needles. Another example of an organic NQR-active tracer capable of crystal formation is 3,4-dichlorobenzamine (N-2). The formulas for N-1 and N-2 are shown below.

As noted above, in certain embodiments, the NQR-active tracer 44 is present within the matrix material 46 as a crystalline material. The crystalline material may include a plurality of microcrystals having at least one dimension with a length between approximately 1 micron and 1 millimeter, such as between approximately 10 and 500 microns, 50 and 500 microns, or 100 and 500 microns. Indeed, the micron-scale dimensionality of the microcrystals may enable the collection of information that can be localized to specific sections of the composite. For example, because the microcrystals have at least one dimension on the micrometer scale, the present embodiments enable microscopic strain distributions (e.g., indices of the strain distributions) to be determined. In a general sense, the microcrystals may have any lattice geometry (e.g., triclinic, monoclinic, orthorhombic, tetragonal, hexagonal, and cubic) leading to an electric field gradient that may be disrupted by external mechanical stresses.

In some embodiments, the NQR-active tracers 44 may consist essentially of microcrystalline needles. Indeed, in certain embodiments, it may be desirable to employ microcrystalline needles due to increased sensitivity to localized strain compared to other crystalline geometries. For example, the microcrystalline needles may have a larger aspect ratio compared to other crystalline forms, such as a cube. The larger aspect ratio may result in a crystal electric field gradient that is highly sensitive to a force applied to the composite 42. That is, the probability that the crystal field gradient will be disrupted upon the application of strain to the composite 42 may be higher compared to other crystalline forms. This gradient disruption may lead to a change (e.g., a shift and/or a broadening) in one or more NQR spectral lines of NQR-active nuclei within the tracers 44.

Figure 3:
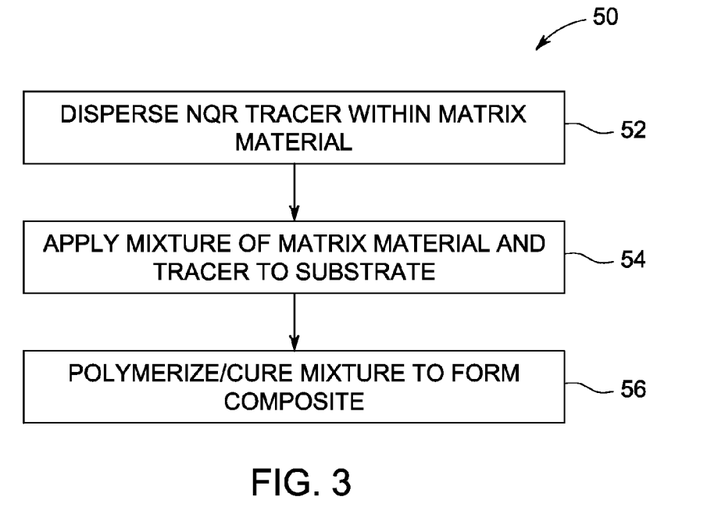
FIG. 3 is a process flow diagram illustrating an embodiment of a method for producing a composite having NQR tracers within a matrix material.

As noted above, the NQR tracers 44 are disposed within the matrix material 46 to form a mixture. The mixture, when applied to an article of manufacture, may be used to facilitate the detection and quantification of fatigue in the article, determine an operational life of the article, and/or determine article strength. FIG. 3 is a process flow diagram illustrating an embodiment of a method 50 for producing an article of manufacture, such as airfoil 40, having the composite 42. In a first step of the method 50, the NQR-active tracer 44 is dispersed within the matrix material 46 (block 52). Generally, the NQR-active tracer 44 may be dispersed within the matrix material 46 in any amount that does not adversely affect the desired properties of the matrix material 46 and/or the resulting composite. In certain embodiments, the NQR-active tracer 44 may be present in an amount ranging from approximately 0.1% by weight (wt %) of the entire mixture to approximately 10 wt %. In some of these embodiments, the NQR-active tracer 44 loading may be between approximately 1 wt % and 5 wt %, inclusive. For example, in one embodiment, the NQR-active tracer 44 may be present in an amount of approximately 2 wt %. The amount of NQR-active tracer 44 that is dispersed within the matrix material 46 may depend on a number of factors, including but not limited to cost, NQR sensitivity, the number of NQR-active nuclei within the tracer 44, the material properties of the tracer 44, and the signal-to-noise ratio that is obtained when using the NQR-active tracer 44. Certain other determining factors as to which NQR-active tracers 44 are dispersed within the matrix material 46 are discussed below. For example, as discussed hereinbelow, certain materials properties of the NQR-active tracer 44 may at least partially determine which NQR-active tracer 44 is selected for dispersal. Other factors, such as spectroscopic considerations, are discussed below with respect to FIG. 6.

In certain embodiments, the dispersal may be such that the tracer 44 is substantially uniformly distributed within the matrix material 46. In embodiments where the tracer 44 is crystalline, the tracer 44 may remain substantially undissolved in the matrix material 46 by choosing a suitable combination of tracer and matrix materials. For example, it may be desirable for the tracer 44 to have a density such that the matrix material 46 is able to suspend the tracer 44 for a desired amount of time while not dissolving the tracer 44. Therefore, the tracer 44 may have a density that is only slightly larger than, substantially equal to, or less than the matrix material 46, with a solubility in the matrix material 46 that is sufficiently low to prevent crystal degradation. Such a density may enable the matrix material 46 to suspend the tracer 44 for an amount of time sufficient to apply the mixture to a substrate and set, polymerize, and/or cure the matrix material 46, without dissolving the tracer. Therefore, while certain matrix materials 46, such as prepolymers, molten polymers, or uncured polymers, may be able to suspend inorganic tracers, it may be desirable in some embodiments for the tracers to be organic, as certain organic materials may have densities that are less than inorganic materials. Therefore, many organic tracers may be readily suspended in many different matrices, such as solvents, monomers, prepolymers, molten polymers, uncured polymers, or a combination thereof, to generate a mixture with a substantially uniform distribution. However, in certain embodiments, such as when the matrix material 46 acts as a strong solvent with respect to organic tracer materials, the tracer 44 may be inorganic.

Additionally, the NQR-active tracer 44 and the matrix material 46 may be chosen such that premature curing and polymerization of the matrix material is avoided. For example, in embodiments where the matrix material is a monomer, a prepolymer, or an uncured polymer prior to application to a substrate, the NQR-active tracer 44 may be chosen such that the tracer does not act as a polymerization or curing catalyst. In such embodiments, an organic NQR-active tracer may be used rather than an inorganic NQR-active tracer, as certain inorganic materials may catalyze polymerization and/or curing processes. However, it should be noted that certain inorganic NQR-active tracers also may be substantially unreactive with monomer, prepolymer, or uncured polymer compositions. Accordingly, in embodiments where the tracer 44 is substantially unreactive with the matrix material 46, the mixture may be stored and used at a later time, or used immediately.

In certain other embodiments, it may be desirable for the tracer to catalyze polymerization and/or curing. In such embodiments, the mixing of the tracer and matrix material may be performed immediately prior to using the mixture to form a composite. Thus, after preparing the mixture (block 52), the mixture may eventually or immediately be applied to a substrate (block 54). The acts represented by block 54 may include coating a surface of a substrate, or pouring the mixture into or onto a mold, wire mesh, or frame. For example, the mixture may be poured into a wire mesh having a geometry resembling a desired article of manufacture, such as a general shape of a wind turbine blade or an aircraft wing. In another embodiment, the mixture may be applied to a polymer or a composite layer, as discussed with respect to FIGS. 4-6. In such embodiments, the mixture may act as an additional composite layer, such as a protective layer or a coating.

After the mixture of the matrix material 46 and the tracer 44 has been applied to the substrate (block 54), the matrix material may be polymerized and, in some embodiments, cured or set (block 56). Specifically, in embodiments where the matrix material includes a monomer or a prepolymer, the matrix material may be polymerized. The polymerization may be performed using an external stimulus such as light or heat, or using a catalyst, or any combination thereof. In embodiments where the matrix material includes an uncured polymer, the matrix material may be cured using heat, light, or a catalyst, or a combination. In embodiments where the matrix material is a molten polymer, the polymer, after application, may be allowed to cool and set. In these embodiments, the rate and manner of polymerization, curing, and/or setting may be chosen to generate a composite having a polymer with desired characteristics, such as a desired molecular weight, melt flow characteristics, density, molecular weight distribution, and/or a desired amount of crosslinking.

Figure 4:
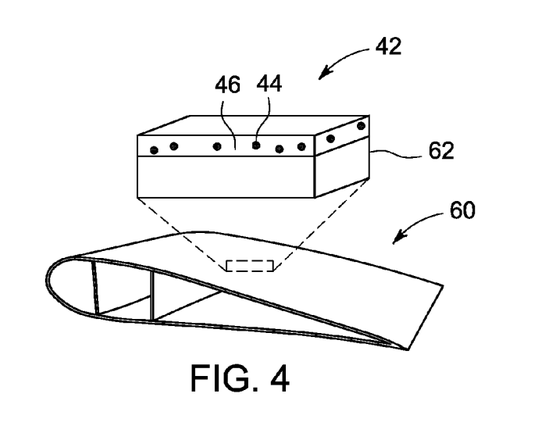
FIG. 4 is a schematic illustration of an embodiment of an article of manufacture having a composite coating, the coating having NQR tracers disposed within a matrix.

As noted above with respect to block 54, the composite 42 may be applied to an existing polymer and/or composite layer. FIG. 4 illustrates an embodiment of an article of manufacture, such as an airfoil 60, having the composite 42 coated onto an existing polymer and/or composite layer 62. In the illustrated embodiment, the airfoil 60 includes the existing polymer and/or composite layer 62, which may be a structural layer. The layer 62 does not include an NQR-active tracer, but is coated with the composite 42 to facilitate the detection of fatigue and any deformities that may be present within the airfoil 60. In certain embodiments, the airfoil 60 may represent an existing airfoil that has been coated with the composite 42 to allow such detection. Therefore, in accordance with certain aspects of the present disclosure, an existing article of manufacture may be coated with an NQR-active composite (e.g., composite 42) to facilitate the monitoring and detection of fatigue, joint strength, or localized stresses in accordance with the approaches disclosed herein.

Figure 5:
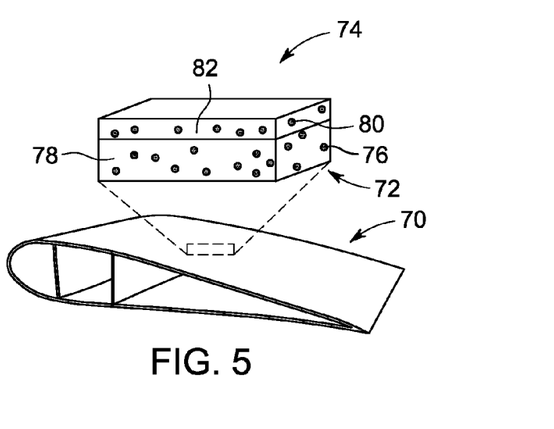
FIG. 5 is a schematic illustration of an embodiment of an article of manufacture having a plurality of composite layers, each layer having an NQR tracer disposed within a matrix.

While FIG. 4 illustrates an embodiment of an airfoil (but could be any composite structure such as an airplane fuselage, a wing, or a vertical stabilizer) having only one NQR-active composite layer, it may be desirable to have multiple NQR-active layers. For example, such multi-layered composites may enable the determination of different strain states (e.g., via line shifting) and microscopic strain distribution indices (e.g., via line broadening) for a particular surface location depending on depth. In this way, multiple NQR-active layers may facilitate the detection of certain fatigue locations within a body of an article of manufacture. FIG. 5 illustrates an embodiment of an airfoil 70 having a plurality of NQR-active composite layers. Specifically, the airfoil 70 includes a first NQR-active composite layer 72 and a second NQR-active composite layer 74 coated over the first layer 72. The first layer 72 includes at least a first NQR-active tracer 76 dispersed within a first matrix material 78. The first NQR-active composite layer 72 may be formed in accordance with method 50 described above. Therefore, the first NQR-active composite layer 72 may be a structural layer of the article of manufacture, a protective layer on the article, or a coating on the article.

Similarly, the second NQR-active composite layer 74 includes at least a second NQR-active tracer 80 dispersed within a second matrix material 82. Generally, the first and second matrix materials 78, 82 may be the same or different, and the first and second NQR-active tracers 76, 80 may be the same or different. Indeed, while the illustrated embodiment depicts two distinct layers due to different matrix materials 78, 82, in certain embodiments, the matrix materials 78, 82 may be the same such that a cross-section of the airfoil 70 only reveals a single layer having different NQR tracers.

The second NQR-active composite layer 74 may be applied to the first NQR-active composite layer 72 in accordance with the method 50 described with respect to FIG. 3. Accordingly, the first NQR-active composite layer 70 may be considered to be the substrate for the second NQR-active composite layer 72. Indeed, method 50 may be iterated a number of times to form an article of manufacture having a plurality of NQR-active layers. Moreover, because the layers have different NQR-active tracers, it may be possible to determine the depth (i.e., size), shape, and/or extent of any defects and/or fatigue that may be present within the article of manufacture by measuring strain maps and determining microscopic strain distribution indices dependent on depth. The collected data (e.g., microscopic strain distribution indices and/or strain change data), in accordance with certain embodiments, may be used to generate 3-D strain maps. In certain embodiments, the NQR-active tracers may be chosen such that they resonate at distinct frequencies to facilitate detection and to prevent data convolution.

Figure 6:
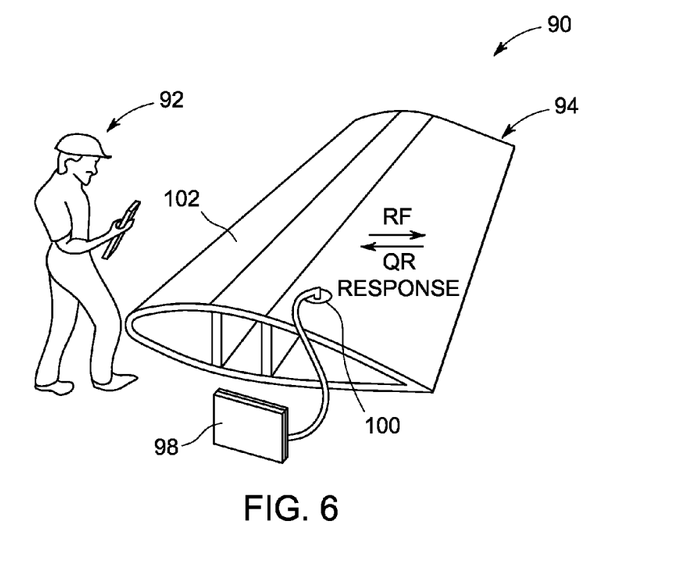
FIG. 6 is a schematic illustration of an embodiment of a measurement performed by a technician using a portable NQR spectrometry system.

As noted above, the present embodiments enable the quantification of fatigue, the detection of incipient failure indicators (e.g., microcracks, swelling, fiber waviness), and, in certain embodiments, the determination of remaining operational life of various articles of manufacture using strain change information and microscopic strain distribution indices determined for various locations of a composite. FIG. 6 depicts an embodiment of the manner in which an article of manufacture may be monitored to detect structural indications of fatigue, failure, and/or remaining operational life. Specifically, FIG. 6 is an illustration of a measurement 90 as performed by a technician 92 to identify the presence of macroscopic indicators and microscopic strain distribution index indicators of fatigue within an airfoil 94. Again, the structure could be any composite structure such as an airplane fuselage, a wing, or a stabilizer. The airfoil 94 includes a composite 96 that includes one or more NQR-active materials, such as NQR-active tracers (e.g., microcrystalline NQR tracers). As may be appreciated with reference to the illustrated embodiment, the article of manufacture, specifically the airfoil 94, may be large so as to preclude the use of a traditional spectrometer or a traditional solenoid coil, which typically surround a subject of interest, for data capture. Accordingly, the present embodiments provide a portable NQR spectrometer 98 that may be used by the technician 92 to perform NQR spectroscopy measurements on various locations of the airfoil 94. The portable NQR spectrometer 98 includes a handheld RF probe 100 that is capable of transmitting RF energy into the composite 96 to excite the NQR-active nuclear spins, and is also capable of receiving the emitted signals as these nuclear spins precess and relax. The NQR data may be stored in the portable spectrometer 98 and transferred to an application-specific or a general purpose computer at a later time for analysis. In other embodiments, the portable spectrometer 98 may also perform analysis in addition to data acquisition. For example, in one embodiment, the portable spectrometer 98 may include one or more processors that are capable of analyzing spectral lines for shift (e.g., due to strain) and broadening (e.g., due to localized strain distributions). In combination with the identification of a shift in a central NQR line frequency for the spectral lines, the localized, broadened signals may be used to create a series of microscopic strain distribution indices that may be presented in the form of a map. For example, strain maps providing strain change information may be generated, and, additionally or alternatively, microscopic strain distribution index maps may be generated. Indeed, to enable the portable spectrometer 98 to perform such tasks, the portable spectrometer 98 may include a USB-interfaced spectrometer card. Certain features of the portable spectrometer 98 and the RF probe 100 are discussed below with respect to FIG. 7. Generally, the portable spectrometer 98 and the handheld RF probe 100 enable the technician 92 to perform one or more analyses of the airfoil 94 along its surfaces.

For example, during NQR measurements on the airfoil 94, the technician 92 may place the RF probe 100 over an external surface 102 of the airfoil 94 to acquire NQR data from the composite 96. The RF probe 100 includes a contact surface 104 that may be placed in direct contact with the external surface 102 at certain locations, or the contact surface 104 may be passed over the entire external surface 102 at regular intervals by the technician 92. For example, in some embodiments, the airfoil 94 may be marked at specific locations on the external surface 102. The RF probe 100 may be placed at those locations and NQR data recorded and correlated to the locations to generate a map of the collected NQR spectra. In other embodiments, the RF probe 100 may be used to perform NQR scans of the entire external surface 102 to generate the map of the collected NQR spectra. For example, in some embodiments, the localized NQR spectra may be analyzed for locations displaying spectral line shifting and/or broadening (as illustrated in FIG. 1 with respect to elements 30-36), which may be used to generate a localized, microscopic strain distribution index. Indeed, as is described below, the resulting localized NQR spectra may be used to generate strain maps for fatigue/failure analysis as well as for lifing of the airfoil 94. Again, the analysis system and methods described herein may be applicable to any such article of manufacture.

It should be noted that, in some embodiments, the time required for each NQR measurement (e.g., each measurement at a specific location on the external surface 102 of the airfoil 94) may be mostly dependent on the T1 time constant (i.e., spin-lattice relaxation constant) of the NQR-active nuclei within the NQR-active tracers. For example, in some embodiments, as the T1 time constant increases, so does the time required for each NQR data acquisition. In some embodiments, the T1 time constants for certain NQR-active materials are on the order of approximately 1 to 900 milliseconds (ms), though in certain embodiments, the T1 time constant may be much longer (e.g., 2 seconds), or much shorter (e.g., 100 microseconds).

T1 constant values describe the time that is required for the longitudinal magnetization component of a given gyromagnetic nucleus to return to approximately 63% ($1-e^{-1}$) of its equilibrium magnetization, i.e., its ground state. Therefore, the T1 value of a given nucleus may at least partially determine the rate at which a given excitation-emission-detection cycle for NQR spectroscopy may be repeated, i.e., the repetition rate. Because many scans may be desirable to increase signal-to-noise ratios, it may be desirable, in some embodiments, to have an NQR-active tracer with a relatively short T1 time constant. Generally, the room temperature (i.e., between 23 and 27° C.) T1 value of the NQR tracers described herein may vary from between approximately 1 ms to approximately 1000 ms, such as between approximately 1 ms and 500 ms, 5 ms and 250 ms, or 10 ms and 150 ms. As an example, $Cu_2O$ has a T1 value of approximately 140 ms while BCPS (N-1) has a T1 value of approximately 10 ms. Therefore, based on T1 values alone, using BCPS (N-1), compared to $Cu_2O$, approximately 14 times as many scans may be performed in the same amount of time. Another tracer example is $Mo_3Sb_7$, which has a T1 value of approximately 2.5 ms. It should be noted, however, that in some embodiments, spin-lattice relaxation may be affected by the temperature of a given sample. Accordingly, T1 values and, therefore, the NQR spectra of the sample may be affected. For example, at increased temperatures, spectral lines may broaden which can lead to convoluted data. This may be particularly problematic in embodiments where spectral line broadening is observed to generate microscopic strain distribution indices. Moreover, a sharper NQR spectral line may provide more detailed information regarding macroscopic strain changes. Accordingly, it may be desirable to use a material with a short T1 value.

While the T1 values of NQR-active nuclei are largely determinate of the time required for each acquisition, other factors may determine the number of scans that are suitable for obtaining a desired signal-to-noise ratio, which can affect the ability to accurately and reproducibly determine localized macroscopic strain changes and/or microscopic strain distribution indices. Specifically, the duration of the free induction decay of the NQR-active nuclei as well as the quality (Q) factor of the coil that is used for the NQR signal detection (e.g., the detection coil within the RF probe 100) may be determining factors for total scan time and signal-to-noise ratio. In a general sense, the longer the duration of the FID, the greater the signal-to-noise ratio. In embodiments where signal-to-noise ratio is increased, the number of scans suitable for generating useful data may decrease. Accordingly, it is generally desirable to use an NQR tracer with a long duration FID to facilitate the determination of microscopic strain distribution indices.

In some embodiments, the FID duration of a particular material is dependent on the T2 value of the NQR-active material. Generally, room temperature T2 values for NQR-active tracers may range from between about one microsecond to about 10 milliseconds. For example, in some embodiments, the T2 values for the NQR tracer may be between approximately 1 microsecond and 250 microseconds. Referring to the examples provided above with respect to T1 values, at room temperature, $Cu_2O$ has a T2 value of approximately 50 microseconds, BCPS (N-1) has a T2 value of approximately 500 microseconds, and $Mo_3Sb_7$ has a T2 value of approximately 222 microseconds.

The precession and decay of the transverse magnetization component of gyromagnetic nuclear spins results in the production of the signal detected by an RF coil, i.e., the FID. Specifically, the emitted signal when the transverse magnetization begins to decay creates an oscillating voltage in a detection coil (e.g., within the RF probe 100). For at least this reason, certain properties of the coil, such as the quality (Q) factor, may also affect the duration of the FID as well as the amplification of the FID by the coil. Therefore, certain properties of the coil may also affect signal-to-noise ratio, and thus the ability to generate accurate and reproducible microscopic strain distribution indices and macroscopic indicators of average strain changes. For example, after the provision of an RF excitation pulse, the detection coil may ring for a certain duration. To acquire FID without signal contamination from this ringing, a delay may be employed, which is considered the ringdown delay. During this delay, the FID decays, reducing the peak FID that may be collected. Accordingly, it is generally desirable to reduce ringdown delay such that FID may be acquired as soon as possible. In a general sense, the larger the Q factor of the detection coil, the longer the ringdown time. In this regard, it may be desirable to reduce the Q factor of the detection coil. Conversely, the ability of the coil to amplify the FID increases with increasing Q factor. Therefore, there may be a Q factor range that is desirable for each resonant frequency used for detection. Indeed, while the Q factor may be decreased, signal-to-noise ratio may increase. In other embodiments, rather than optimizing the Q factor of a coil, it may be desirable to use an active method to damp the receiver circuit briefly during the RF pulse to reduce ringdown. The high Q factor may then be restored to enhance the FID signal.

It should be noted that the duration of the FID, and thus the T2 value, of each NQR tracer may affect the microscopic strain distribution indices obtained during a particular examination. Specifically, the duration of the FID results in a certain spectral line width. For example, in a general sense, the shorter the FID, the broader the spectral line width as measured at the FWHM of each spectral line. Broader line widths can lead to data convolution, insensitivity to applied strain, and poor signal-to-noise ratios. Accordingly, it may be desirable to use a material with a relatively narrow spectral line width. As an example, relatively wide spectral line widths may be approximately 15 kHz and above, and relatively narrow spectral line widths may be lower than approximately 14 kHz. As an example of certain NQR-active materials, at room temperature, $Cu_2O$ has a FWHM of approximately 15 kHz at 26 MHz, certain alkali-chloro iodides have a FWHM of approximately 2-5 kHz at between 15 and 30 MHz, and BCPS (N-1) has a FWHM of approximately 11 kHz in powdered form and approximately 1 kHz in single crystal form at approximately 34.35 MHz. Accordingly, in certain embodiments, such as to increase sensitivity for the generation of a microscopic strain distribution index, it may be desirable to use NQR-active materials such as BCPS (N-1), alkali-chloro iodides, and other materials having similar spectral line widths as opposed to materials such as $Cu_2O$. Indeed, in certain embodiments, the spectral line width (and thus the microscopic strain distribution index) may be directly correlated to the FID duration and the T2 value.

In sum, in certain embodiments, it may be desirable to select an NQR-active tracer material that has a short T1 value and a long T2 value (i.e., a long FID duration and a narrow spectral line width). Keeping in mind these and other of the various considerations described above, it also may be desirable to increase the sensitivity of the detection features of the portable spectrometer 98. Advantageously, the RF probe 100 of the portable spectrometer 98, in accordance with the present approaches, is configured such that it may be placed directly on the external surface 102 of the airfoil 94, as noted above. For example, in some embodiments, the RF probe 100 includes one or more surface coils. The surface coil of the RF probe 100 enables the probe 100 to transmit and receive RF signals to and from the NQR-active nuclei with minimal signal loss that can be caused by increased separation between the probe and the tracers. The RF probe 100 may also include various features for correlating the position of the probe 100 with the position of the base of the portable spectrometer 98, for example to produce localized NQR spectra with respect to the airfoil 94.

Figure 7:
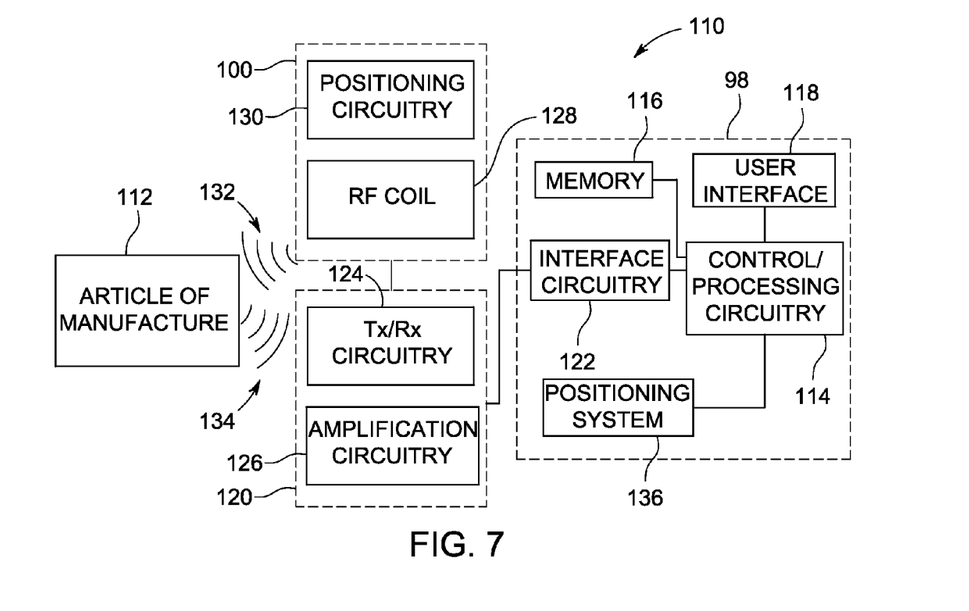
FIG. 7 is a block diagram illustrating an embodiment of a portable NQR spectrometry system.

FIG. 7 illustrates an embodiment of a portable NQR spectroscopy system 110. In the illustrated embodiment, the portable spectrometer 98 and the RF probe 100 contain circuitry that enable the collection of localized NQR measurements to obtain localized NQR spectra. The circuitry may also perform measurements of certain features of the spectra, such as the shifting of spectral lines after an applied stress, line broadening after an applied stress, and so forth. The circuitry may also be configured to generate reference indices, such as microscopic strain distribution indices, that may be compared to measured information, such as measured spectral line broadening and/or spectral line shifting, or new indices generated from these measurements for comparison to the reference indices. For example, a particular microscopic strain distribution index (e.g., a threshold value) may be chosen as a reference value to which measured values or indices generated from the measured values are compared (e.g., by a technician using the spectrometer 98 or by the spectrometer 98) to determine the presence of localized structural abnormalities.

In a general sense, the portable spectrometer 98 may be a portable general purpose or application-specific computer, such as a spectrometer box, a notebook, a tablet, a laptop, or any computer-based device capable of storing analysis sequences and controlling various components of the spectrometer. In the illustrated embodiment, the portable spectrometer 98 includes control and processing circuitry 114, which may include one or more processors capable of accessing and performing computer-based routines for performing the NQR analyses. For example, the control and processing circuitry 114 may be adapted to perform one or more routines for collecting NQR spectra and correlating the spectra to discrete locations of a composite. The control and processing circuitry 114 may correlate NQR spectra to locations of the composite to which stress has been applied to obtain strain-related information. Additionally, in some situations, the control and processing circuitry 114 may correlate NQR spectra obtained from a relatively un-stressed location for the generation of baseline information, for example to generate a microscopic strain distribution index to which the measured information can be compared. In other embodiments, various microscopic strain distribution indices may be generated for a composite that has been placed in operation. The control and processing circuitry 114 may automatically choose a specific microscopic strain distribution index (e.g., via commands resulting from modeling, trial-and-error, or the like), or a user of the spectrometer 98 may choose a specific microscopic strain distribution index, and the microscopic strain distribution indices that are newly-generated may be compared to the baseline or chosen index to determine the presence of structural abnormalities. In further embodiments, the control and processing circuitry 114 may simply compare line shifting, line broadening, or values accounting for either or both of these, to the chosen microscopic strain distribution index (i.e., the reference index).

Indeed, the control and processing circuitry 114 may analyze the NQR spectra for spectral line shifts and spectral line broadening due to spectral line decomposition arising from the application or experience of localized stresses. In certain embodiments, the data collected by the spectrometer 98 and processed by the control and processing circuitry 114 may be used to generate 2-d and 3-d strain maps (e.g., from macroscopic strain change information and/or microscopic strain distribution information). The strain maps may be compared to one or more localized microscopic strain distribution indices, or an original microscopic strain distribution index map.

In certain embodiments, the control and processing circuitry 114 may assign a severity index for each location or for the entire composite. The severity index may be chosen depending on trial-and-error, modeling, or a combination thereof, and may generally represent a threshold indicator for the presence of a particular structural abnormality. The localized microscopic and/or macroscopic strain change information (e.g., a newly-generated microscopic strain distribution index) that has been generated by performing the NQR measurements may be compared to the severity index to determine whether a particular location is strained, fatigued, or the like, and the degree to which the location may be strained and/or fatigued. In some embodiments, the severity index may correspond to a particular value of a microscopic strain distribution index.

The control/processing circuitry 114 may access the computer-based NQR analysis and control routines on a local memory 116, which may store the NQR routines, pulse sequences, information regarding the shape and size of certain articles of manufacture, as well as routines for correlating such information with the NQR analysis routines to generate localized NQR spectra. In certain embodiments, the memory 116 also may store routines for generating strain maps, microscopic strain distribution indices, and microscopic strain distribution index maps from the NQR spectra.

The control and processing circuitry 114 may be addressed at a user interface 118, which a user may utilize to direct the spectrometer 98 to perform various NQR analyses on the article of manufacture 112. For example, the user interface 118 may allow a user to adjust the frequency used for NQR excitation and the frequency window of detection, to enter information about the article of manufacture 112, or similar user inputs. The control/processing circuitry 114 may interface with an RF circuit assembly 120 using interface circuitry 122, such as drivers and other similar features, which are configured to transfer data between the portable spectrometer 98, the RF circuit assembly 120, and the RF probe 100. The interface circuitry 122 enables the control/processing circuitry 114 to send command signals to the RF circuit assembly 120 to command the acquisition of NQR data from the article of manufacture 110 via the RF probe 100. In the illustrated embodiment, the RF circuit assembly 120 is separate from the portable spectrometer 98. In such a configuration, the RF circuit assembly 120 may be a portable spectrometer card that interfaces with a general purpose or application-specific computer using, for example, a universal serial bus (USB) connection, an Ethernet connection, a wireless connection, or a similar connection. In other embodiments, the RF circuit assembly 120 may be contained within the portable spectrometer 98. In such a configuration, the portable spectrometer 98 may be an application-specific spectrometer including the RF circuit assembly 120 as one or more spectrometer cards.

To acquire and receive data, the RF circuit assembly 120 includes transmission and receiving (Tx/Rx) circuitry 124 and various amplification circuitry 126. The Tx/Rx circuitry 124 may include various drivers as well as certain processing and/or control circuitry for producing digitized or analog pulse sequences as defined by the control/processing circuitry 114. Additionally, the Tx/Rx circuitry 124 may include a duplexer for switching an RF coil 128 within the RF probe 100 between a transmitting state and a receiving state. The RF circuit assembly 120 also includes amplification circuitry 126, such as a power amp for amplifying the RF pulses transmitted by the RF coil 128 and a low noise amplifier (LNA) for amplifying received signals, among others. The amplification circuitry 126 also may include various filters, such as bandpass filters, for blocking or removing undesired signal received by the RF coil 128.

In the illustrated embodiment, the RF probe 100 includes the RF coil 128 and positioning circuitry 130. The RF coil 128 may include one or more coils each being capable of transmitting and/or receiving RF signals. In some embodiments, the RF coil 128 may include a solenoid-type coil capable of transmitting RF pulses 132 to excite NQR-active gyromagnetic nuclei within the article of manufacture 112, and/or capable of receiving RF signals 134 emitted by the nuclei when they return to their equilibrium state. In other embodiments, the RF coil 128 may include one or more surface coils capable of transmitting RF pulse sequences 132 to the gyromagnetic nuclei and/or capable of receiving RF signals 134 emitted by the nuclei. In one embodiment, it may be desirable to use a surface coil as the RF coil 128 due to a flatter profile than the solenoid-based coil and also due to certain signal to noise considerations, as noted above. For example, the flatter profile of the surface coil may allow a larger portion of the RF coil 128 to be placed closer to the contact surface 104 of the probe 100 and, therefore, closer to a surface of the article of manufacture 112 than would be possible with a solenoid coil. This close spatial relationship, as noted above, may increase signal-to-noise ratio.

As noted above, the RF probe 100, as depicted, also includes positioning circuitry 130. The positioning circuitry 130 may include a transponder or similar feature that enables the portable spectrometer 98 to determine the position of the RF probe 100 in relation to the portable spectrometer 98 using a positioning system 136. For example, the positioning system 136 of the portable spectrometer may include a system (e.g., a global positioning system (GPS)) that tracks the location of the portable spectrometer 98 using satellites or other triangulation features that may be accessed remotely or positioned by a user. In certain embodiments, the location of the portable spectrometer 98 and/or the RF probe 100 may be determined in relation to the article of manufacture 112 using the positioning circuitry 130 and the positioning system 136. Determining such a positional relationship may facilitate the localization of NQR spectra that are obtained using the system 110. Indeed, the localization of the NQR spectra may be used to generate localized macroscopic and/or microscopic strain maps, as discussed below.

Figure 8:
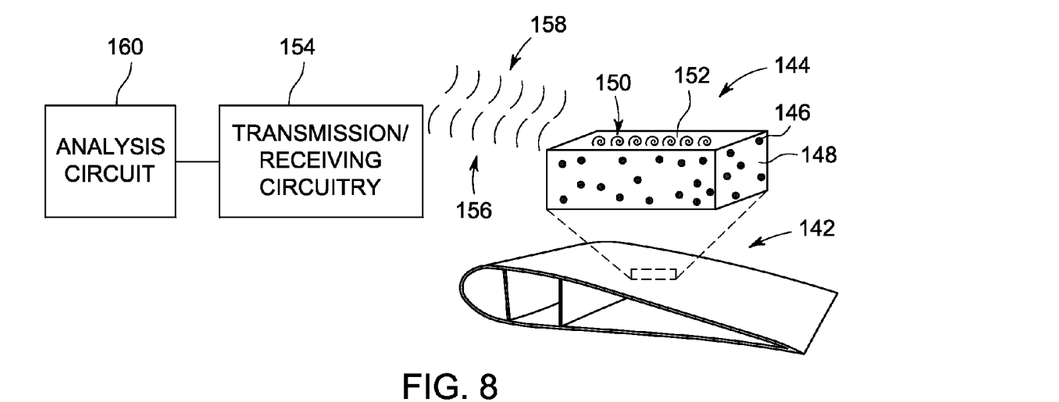
FIG. 8 is a schematic illustration of an embodiment of a remote analysis system for capturing NQR data using one or more printed surface coils disposed on a composite having NQR-active tracers disposed within a matrix.

As noted above, the proximity of transmission/detection coils to the NQR tracer materials within various articles of manufacture may advantageously increase signal-to-noise ratio, which can reduce analysis time and also lead to a greater probability of detecting any structural abnormalities that may be present. Accordingly, in some embodiments, in addition to, or in lieu of using a portable spectrometer and probe as described above, the respective embodiments also provide systems for remote interrogation of the NQR tracer materials. FIG. 8 illustrates an embodiment of one such generalized remote analysis system 140. System 140 includes an article of manufacture, such as an airfoil 142, having a composite 144 with NQR tracers 146 disposed within a matrix material 148 as described above with respect to FIGS. 2-5. Additionally, one or more printed coils 150 are disposed on a surface 152 of the composite 144. The one or more printed coils 150 may be printed or otherwise formed directly onto or directly beneath the surface 152 using an electromagnetic material in a circular pattern, a rectangular pattern, a square pattern, an elliptical pattern, a triangular pattern, or any other pattern. Generally, the one or more printed coils 150 are configured (i.e., tuned) to resonate at one or more of the resonant frequencies of the NQR tracers 146. In some embodiments, the coils 150 may be passive coils that are remotely energized using an external RF source, such as using transmission/receiving circuitry 154.

In such an embodiment, the transmission/receiving circuitry 154 may send one or more signals 156 to energize the coils 150. For example, the signals 156 may be RF signals tuned to a frequency of the coils 150 that cause the coils 150 to emit certain excitation RF pulses. The excitation RF pulses are directed toward the NQR tracers 146. The tracers 146 may then resonate with the coils 150 as they decay to their respective equilibrium states. The coils 150 may, in turn, emit detection signals 158 that are received by the transmission/receiving circuitry 154 and analyzed by analysis circuitry 160. The analysis circuitry 160 may analyze the signals to determine the presence of structural abnormalities within the composite 144 and thus, the article 142 in accordance with the methods discussed with respect to FIGS. 9 and 10. For example, the analysis circuitry 160 may determine the presence of localized broadened spectral lines (e.g., for a spectral line of interest) compared to other locations of the airfoil 142 and/or the presence of localized shifted spectral lines for a spectral line of interest, and may produce a severity index for all locations based on a comparison between the microscopic strain distribution indices and/or macroscopic strain change data generated for the locations having broadened and substantially unbroadened and/or unshifted spectral lines. Again, the indices and/or the strain change data may be used to generate a strain map.

In other embodiments, the printed surface coils 150 may be interrogated using a separate RF coil. For example, the separate RF coil may be configured to energize the coils 150 to eventually excite the NQR nuclei, or the RF coil may be configured to directly excite the NQR nuclei. In embodiments where the RF coil directly excites the NQR nuclei, the printed surface coils 150 may resonate with the signals emitted by the excited NQR nuclei as they decay to their equilibrium magnetization state. Moreover, in certain embodiments, the printed surface coils 150 may each have a distinct signature signal that is transmitted along with the NQR information. This may allow the determination of the point of origin of the transmitted signal, which allows the resulting NQR spectra, and thus the macroscopic strain change data and microscopic strain distribution indices to be localized.

Figure 9:
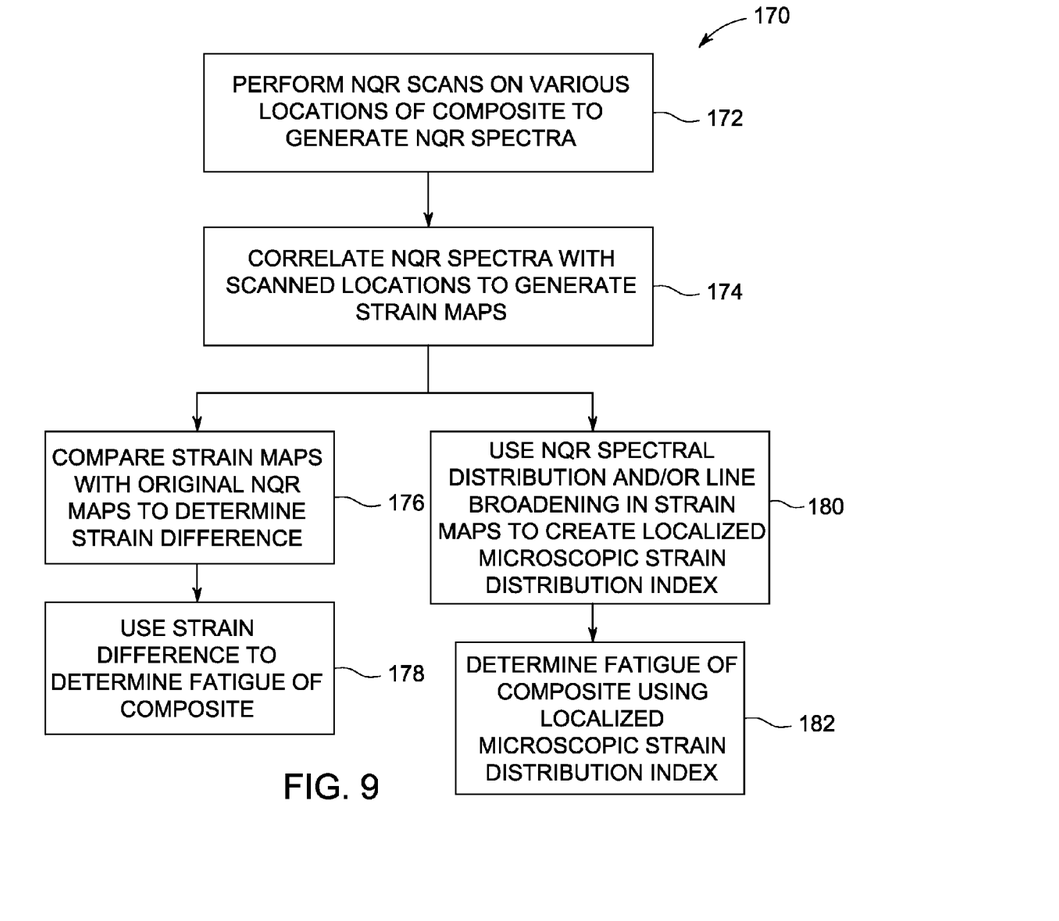
FIG. 9 is a process flow diagram illustrating an embodiment of a method for determining fatigue within a composite using strain maps and microscopic strain distribution indices generated from location-correlated NQR spectra.
Figure 10:
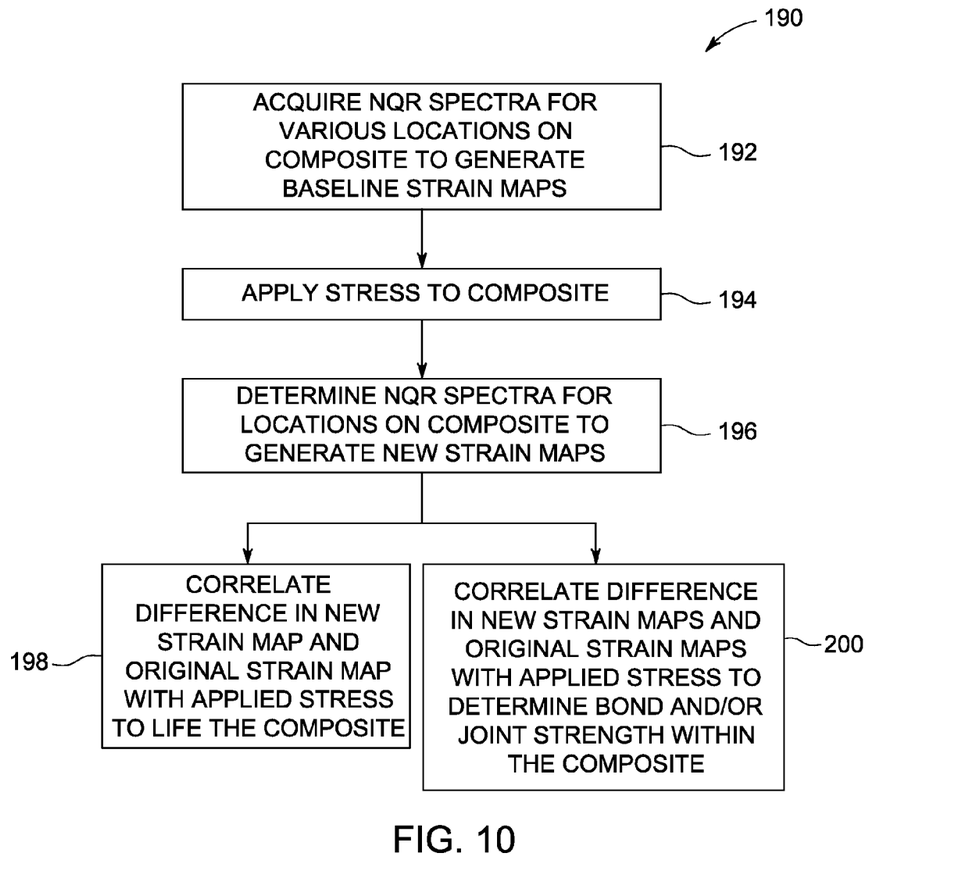
FIG. 10 is a process flow diagram illustrating an embodiment of a method for determining the operational life of a composite using strain maps and microscopic strain distribution indices generated from location-correlated NQR spectra.

Using some or all of the systems and methods described above, the present embodiments also provide methods for the generation of macroscopic strain maps and/or microscopic strain distribution index maps for strain localization, fatigue determination, article lifing, and so on. FIGS. 9 and 10 present such methods in the context of process flow diagrams that may be performed by certain spectroscopic control circuitry, a technician, or a combination. Specifically, FIG. 9 illustrates a process flow diagram of an embodiment of a method 170 for generating strain maps to determine fatigue and detect structural defects within an article of manufacture having an NQR-active composite. The article of manufacture may be entirely formed from the composite, or the composite may form only a portion of the article. In other embodiments, the composite may be a coating on the article. The method 170 begins with performing NQR scans on various locations of the composite (block 172).

The locations that are scanned are correlated with their respective NQR spectra to generate a set of strain maps (block 174). It should be noted that while the NQR scans are performed on, for example, the surface of the composite or article of manufacture, that 3-D data may be obtained, enabling the formation of two- or three-dimensional strain maps. Such three-dimensional strain maps, in addition to providing surface information, may provide structural information regarding the body of the composite or article of manufacture. The acts represented by block 174 may be performed after the NQR scans have been performed, or while the scans are performed. For example, in one embodiment, the features used to generate the NQR spectra may contain one or more spatial correlation features, such as the positioning system 136 described above with respect to FIG. 7. The correlation features may record the NQR spectra and correlate the spectra with their respective locations as they are collected. In other embodiments, the user may collect the spectra at certain predetermined locations on the composite. The predetermined locations may be tick marks on the composite that are identified and scanned. The identification may correlate the collected spectra with the locations.

To generate the strain maps in block 174, the spectra that are collected and location-correlated are analyzed for certain deterministic features, such as line broadening, frequency shift, spectral line decomposition, and the like. The nature of the deterministic features may then be correlated with strain that the composite has encountered. For example, as noted above, certain microscopic strain distribution index values or a certain degree of line broadening or line shifting may be indicative that the polymer of the composite has reached an elastic limit. The magnitude of the microscopic strain distribution index, the amount of line broadening, or the amount of line shifting may therefore be indicative of the degree to which the polymer has become elastic. For example, in accordance with certain embodiments, the degree of strain, fatigue, or deformation may be represented by color in the strain map, which in certain embodiments may be a microscopic strain distribution index map or a macroscopic strain change map (e.g., a local average strain map).

After the strain maps of the article of manufacture have been produced in block 174, the strain maps may be compared to the original strain maps of the article to determine the amount of strain that has accumulated between analyses (block 176). For example, using a similar process to the steps described above, the original NQR and/or strain maps may be produced. The original NQR maps may be compared to the localized NQR spectra, or the original strain maps may be compared to the newly generated strain maps. The comparison may include comparing the different microscopic strain distribution indices of each map, or other deterministic features of a spectral line of interest used to generate the strain data. For example, the original data of the original strain maps (or NQR maps) may be subtracted from the new data of the newly generated strain maps. The subtraction (or other comparative function) may result in location-correlated strain difference information.

The location-correlated strain difference information, such as a microscopic strain distribution index difference and/or a local average strain difference, may be used to identify structural abnormalities (block 178). Specifically, the structural abnormalities may include areas of fatigue, areas having microcracks, swelling, fiber waviness, and so on. In some embodiments, the magnitude of the strain difference information may quantify the amount of strain that the article of manufacture has accumulated between analyses. Such quantification may allow the determination of the remaining life of the article. Indeed, the present embodiments may enable the observation of both macroscopic strain information localized to a particular portion of a composite, and may also enable the observation of microscopic strain distribution information within the average to provide both microscopic and macroscopic information regarding the mechanical state of the composite at the particular portion.

While strain maps made from microscopic strain distribution information and/or average strain change information may be used to quantify and/or identify fatigue, in other embodiments, the NQR spectral distributions that result in line broadening may be used to create one or more localized microscopic strain distribution indices (block 180) that are used for these purposes. For example, the degree to which each spectral line is broadened compared to a spectral line of an undisturbed sample may be directly related to the magnitude of each index. Accordingly, the greater the distribution of signals, the greater the line broadening, and the larger the microscopic strain distribution index. Indeed, the magnitude of each microscopic strain distribution index may be correlated with the fatigue of the composite (block 182). For example, as noted above, structural abnormalities may include areas of fatigue, areas having microcracks, swelling, fiber waviness, and so on. In some embodiments, the magnitude of each index may be used to quantify the amount of stress that the article of manufacture has encountered at particular locations. For example, using one or more modeling methods that will be apparent to those of ordinary skill in the art, a model may be developed that correlates microscopic strain distribution indices (and/or average strain change information) with amounts of fatigue and/or structural deformities. For example, several trials may be conducted to correlate the level of failure and/or fatigue in an article with certain microscopic strain distribution indices to generate, as an example, a look-up table. The look-up table may be consulted in runs where the amount of spectral line broadening, the microscopic strain distribution index magnitude, or spectral line shifting is determined to obtain the level of failure in the article. This quantification may allow a user to predict the remaining life of the article. Therefore, in certain embodiments, the fatigue of an article may be determined directly using one or more microscopic strain distribution indices and, in some embodiments, average strain change data, rather than by comparing one or more newly generated strain maps to one or more original strain maps. Such correlations may obviate the need to have a strain map or strain-related information for a particular article of manufacture.

In certain embodiments, it may be desirable to perform testing on various articles of manufacture for quality control purposes. FIG. 10 is a process flow diagram illustrating an embodiment of a method 190 for determining the overall operational life of a composite. It should be noted that method 190 is also applicable to the determination of joint strength, such as joints that are sealed or formed using a composite. Method 190 begins with acquiring NQR spectra on various locations of a post-production composite having NQR-active tracers (e.g., microcrystalline tracers) dispersed therein (block 192). The NQR spectra are correlated with their locations, for example as described with respect to FIG. 9, to generate a baseline strain maps that may be used for comparison at a later time. It should be noted that while the present embodiment is discussed in the context of generating baseline strain maps, in certain embodiments, such baseline strain maps may not be generated, and the measurements discussed below may be used in combination with one or more modeling methods and/or experimental correlations as discussed above.

After the baseline strain maps are generated, a controlled, known amount of stress is applied to the composite (block 194). For example, the composite may undergo stress testing, impact testing, thermal testing, cryological testing, and so forth. Generally, the testing is performed so as to disturb the electric field gradient of the NQR-active tracers within the composite. This may result in the generation of new localized NQR spectra. For example, the controlled amount of stress may cause the NQR-active microcrystals proximate the location of the applied stress to be disturbed, which causes frequency shifts of their respective NQR spectra. Because each of these shifts may be small and cause the spectral lines to overlap, the spectral lines become broadened. This line broadening correlates to a microscopic strain distribution, where the degree of the broadening may be correlated to the amount of strain distribution on a micron scale. Similarly, the controlled amount of stress may cause an overall frequency shift of an NQR signal (i.e., in addition to or in lieu of broadening), which represents an average change in the strain at the location of the applied stress. Indeed, such a shift may be indicative that the composite may be reaching its mechanical limits.

Thus, after the controlled stress has been applied to the composite, NQR spectra are collected from the NQR-active tracers within the composite. In some embodiments, the new NQR spectra may only be collected in the area where strain is applied. In other embodiments, the new NQR spectra may be collected throughout the composite to determine whether the application of strain has remote (i.e., long distance) effects on the composite. The new location-correlated NQR spectra are then used to generate new strain maps (block 196).

As described with respect to FIG. 9 above, the baseline strain maps and the newly generated strain maps may then be compared to determine the strain difference in the maps. The difference data, which may be line broadening difference data, microscopic strain distribution index difference data, line shift data, or the like, is then correlated with the amount of applied stress to extrapolate the life of the composite (block 198). Indeed, the difference data may also be correlated with the mechanical strength or other mechanical properties of the composite. For example, the nature of the structural abnormalities identified by the NQR spectra in relation to the amount of applied stress may facilitate the determination of breaking strength (e.g., for joint strength applications), as well as the number of strain cycles required for breakage (e.g., to determine operational life). In embodiments where the composite having NQR-active materials (e.g., microcrystals) is employed as an adhesive formulation (e.g., to bond two articles together), the difference in the strain maps may be correlated to the applied stress to determine the strength of the bond formed by the adhesive (block 200). Using such data, it may be desirable to adjust certain manufacturing parameters or routine maintenance schedules so as to extend the life of articles of manufacture having certain NQR-active composites or to quality check new articles fabricated using NQR-active composites. Moreover, in the context of servicing a monitored article, the results of a monitoring procedure may result in an actionable output, such as a repair, a reconditioning, or a similar process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of monitoring stress in a composite, comprising:
    scanning the composite using an NQR spectrometer, the composite comprising a polymer matrix and a microcrystalline material disposed in the polymer matrix, wherein the microcrystalline material comprises molecules having nuclei with respective nuclear quadrupole moments;
    correlating using the NQR spectrometer, one or more locations of the composite with NQR spectra collected at the one or more locations to produce localized NQR spectra;
    generating using the NQR spectrometer, an average local strain map of at least a portion of the composite from the NQR scan;
    comparing using the NQR spectrometer, the generated average local strain map to an original strain map of the composite; and
    determining using the NQR spectrometer, differences between the generated average local strain map and the original strain map based on the comparison of local strain data contained within each map to quantify fatigue in the composite.

2. The method of claim 1, comprising:
    determining a line width for a spectral line of interest within each localized NQR spectrum;
    determining a respective microscopic strain distribution index for each spectral line of interest, wherein the microscopic strain distribution index comprises a ratio between a full width at half maximum (FWHM) and a central NQR line frequency of the spectral line of interest; and
    identifying locations that are stressed based on the average local strain map and at least one microscopic strain distribution index to identify the presence of structural fatigue, structural precursors to failure, or a combination thereof.

3. The method of claim 2, comprising quantifying fatigue of a location of the composite using a magnitude of the microscopic strain distribution index.

4. The method of claim 1, wherein the strain maps are generated using localized NQR frequencies, localized NQR spectral line widths, or a combination thereof, of the microcrystalline material in the composite.

5. The method of claim 1, comprising:
generating a microscopic strain distribution index map of the composite from the localized NQR spectra;
comparing the generated microscopic strain distribution index map to an original microscopic strain distribution index map of the composite; and
determining differences in the microscopic strain distribution index values for each map to quantify fatigue in the composite.

6. The method of claim 5, wherein the original strain map and the original microscopic strain distribution index map of the composite are generated prior to placing the composite in operation.

7. The method of claim 5, wherein quantifying fatigue comprises comparing magnitudes of the differences in the respective microscopic strain distribution indices of the generated microscopic strain distribution index map and the original microscopic strain distribution index map and correlating the magnitudes with a known or a modeled fatigue level.

8. The method of claim 7, comprising correlating the magnitudes of the differences, the known or modeled fatigue level, or a combination thereof, with a known or modeled remaining operational life of the composite.

9. The method of claim 5, wherein the average local strain map and microscopic strain distribution index map are each three-dimensional maps of the composite.

10. A non-transitory computer readable medium comprising one or more tangible media, wherein the one or more tangible media comprise routines for causing a computer to perform the steps of:
scanning the composite, the composite comprising a polymer matrix and a microcrystalline material disposed in the polymer matrix, wherein the microcrystalline material comprises molecules having nuclei with respective nuclear quadrupole moments;
correlating one or more locations of the composite with NQR spectra collected at the one or more locations to produce localized NQR spectra;
generating an average local strain map of at least a portion of the composite from the NQR scan;
comparing the generated average local strain map to an original strain map of the composite; and
determining differences between the generated average local strain map and the original strain map based on the comparison of local strain data contained within each map to quantify fatigue in the composite.

* * * * *